United States Patent
Seong et al.

(10) Patent No.: US 12,354,522 B2
(45) Date of Patent: Jul. 8, 2025

(54) SOURCE BUFFER OUTPUT SWITCH CONTROL CIRCUIT AND METHOD OF DRIVING THE SAME

(71) Applicant: Magnachip Mixed-Signal, Ltd., Cheongju-si (KR)

(72) Inventors: Eunkyu Seong, Cheongju-si (KR); Hyoungkyu Kim, Cheongju-si (KR)

(73) Assignee: Magnachip Mixed-Signal, Ltd., Cheongju-si (KR)

( * ) Notice: Subject to any disclaimer, the term of this patent is extended or adjusted under 35 U.S.C. 154(b) by 0 days.

(21) Appl. No.: 18/464,418

(22) Filed: Sep. 11, 2023

(65) Prior Publication Data
US 2024/0296776 A1    Sep. 5, 2024

(30) Foreign Application Priority Data
Mar. 3, 2023  (KR) .................. 10-2023-0028441

(51) Int. Cl.
*G09G 3/20* (2006.01)
*H03K 17/0812* (2006.01)

(52) U.S. Cl.
CPC ..... *G09G 3/2092* (2013.01); *H03K 17/08122* (2013.01); *G09G 2310/0291* (2013.01); *G09G 2330/06* (2013.01)

(58) Field of Classification Search
CPC ......... G09G 3/20; G09G 3/2092–2096; G09G 3/3275; G09G 3/3685–3696; G09G 5/003; G09G 5/006; G09G 2310/0264–0297; G09G 2320/0223; G09G 2320/0252; G09G 2330/025; G09G 2330/06; H03K 17/08122
See application file for complete search history.

(56) References Cited

U.S. PATENT DOCUMENTS

| 7,560,974 | B2 | 7/2009 | Noh et al. |
| 9,577,613 | B2 | 2/2017 | Yang et al. |
| 2007/0080921 | A1* | 4/2007 | Wang ................... G09G 3/3677 345/100 |
| 2009/0146682 | A1* | 6/2009 | Lee .......................... H03K 5/04 326/27 |
| 2012/0280965 | A1* | 11/2012 | Lee ...................... G09G 3/3696 345/212 |
| 2016/0093270 | A1* | 3/2016 | Lee ...................... G09G 3/3688 345/82 |
| 2018/0286305 | A1* | 10/2018 | Kim ...................... G09G 3/3275 |
| 2019/0295474 | A1* | 9/2019 | Kim ...................... G09G 3/3291 |
| 2020/0035188 | A1* | 1/2020 | Kim ...................... G09G 3/3685 |
| 2020/0035193 | A1* | 1/2020 | Seong ................... G09G 5/003 |
| 2021/0358370 | A1* | 11/2021 | Kim ........................ G09G 3/20 |
| 2022/0122542 | A1* | 4/2022 | Kim ...................... G09G 3/2074 |

(Continued)

*Primary Examiner* — Keith L Crawley
(74) *Attorney, Agent, or Firm* — NSIP Law

(57) ABSTRACT

A source buffer output switch control circuit for controlling operations of a source buffer output switch configured to transmit a source signal output from a source buffer to a display panel or block the source signal includes: a switch driver configured to generate a switch control signal for controlling the operations of the source buffer output switch based on a switch operation input signal; a current limiter configured to limit a driving current applied to the switch driver in order to control a slew rate of the switch control signal; and a bias block configured to supply the current limiter with a bias voltage for controlling a magnitude of the driving current.

20 Claims, 12 Drawing Sheets

(56) References Cited

U.S. PATENT DOCUMENTS

2022/0208123 A1\* 6/2022 Kim .................... G09G 3/3291
2022/0415279 A1\* 12/2022 Kang ................... G09G 3/3614
2024/0153425 A1\* 5/2024 Kwon ...................... G09G 3/20

\* cited by examiner

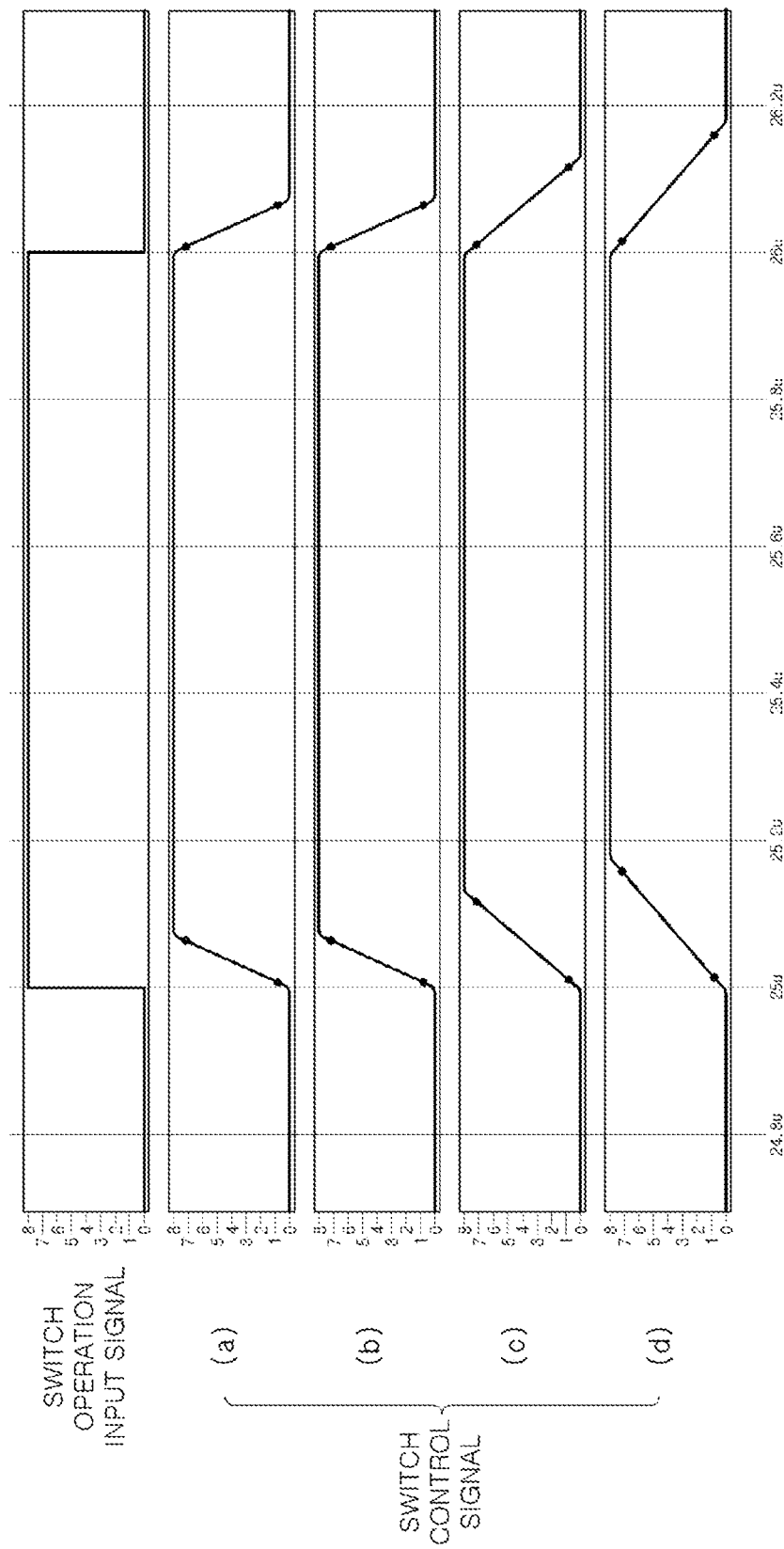

SOURCE BUFFER OUTPUT SWITCH CONTROL CIRCUIT AND METHOD OF DRIVING THE SAME

CROSS-REFERENCE TO RELATED APPLICATIONS

The present application claims the benefit under 35 USC § 119(a) of Korean Patent Application No. 10-2023-0028441, filed on Mar. 3, 2023, in the Korean Intellectual Property Office, the entire disclosure of which is incorporated herein by reference for all purposes.

1. FIELD

The following description relates to a source buffer output switch control circuit and a method of driving the same, and more particularly to a source buffer output switch control circuit that controls the operation of a source buffer output switch that transmits a source signal output from a source buffer to a display panel or blocks the source signal, and a method of driving the same.

2. DESCRIPTION OF RELATED ART

As the technology of a display device develops, a display device having a high resolution and a high image quality is required. In the operation of the display device having a high resolution and a high image quality, there is a requirement for a low-power and high-speed display driver IC capable of operating at a high speed according to the increase in resolution and frame frequency. Depending on the resolution of a display panel, the display driver IC requires thousands or more source buffers, and the resolution may vary according to a source signal transmitted to the display panel from the source buffer.

However, when a source buffer output switch is turned on or off quickly simultaneously in order to transmit a source signal to the display panel from thousands or more of a plurality of source buffers at the same time, there occurs a problem that electromagnetic interference (EMI) due to sudden change in voltage.

Accordingly, it is necessary to control the source buffer output switch such that the electromagnetic interference (EMI) is minimized within a range that does not affect the image quality, by controlling the operation time of the source buffer output switch.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Accordingly, the purpose of various embodiments of the present disclosure is to provide a source buffer output switch control circuit which reduces EMI noise by controlling a period of time required for the source buffer output switch to on or off operate while considering the above-mentioned problem.

The technical problem to be overcome by the present invention is not limited to the above-mentioned technical problems. Other technical problems not mentioned can be clearly understood from the embodiments of the present invention by a person having ordinary skill in the art.

In one general aspect, a source buffer output switch control circuit for controlling operations of a source buffer output switch configured to transmit a source signal output from a source buffer to a display panel or block the source signal, the source buffer output switch control circuit may include: a switch driver configured to generate a switch control signal for controlling the operation of the source buffer output switch based on a switch operation input signal; a current limiter configured to limit a driving current applied to the switch driver in order to control a slew rate of the switch control signal; and a bias block configured to supply the current limiter with a bias voltage for controlling a magnitude of the driving current.

A slew rate of the source buffer output switch may be determined based on the slew rate of the switch control signal.

Based on the switch operation input signal, the switch driver may be configured to receive a first current from a power supply voltage or transmit a second current to a ground voltage, thereby generating the switch control signal. The current limiter may be configured to limit a magnitude of the first current to a first driving current and to limit a magnitude of the second current to a second driving current.

The bias block may be configured to transmit to the current limiter a first bias voltage controlling the magnitude of the first driving current and a second bias voltage controlling the magnitude of the second driving current.

The switch driver may include: a first switch driver configured to output an inverted signal obtained by inverting the switch operation input signal; and a second switch driver configured to output the switch control signal by receiving a first current from a power supply voltage or by transmitting a second current to a ground voltage based on the inverted signal.

The first switch driver may include a first PMOS transistor and a first NMOS transistor connected in series between the power supply voltage and the ground voltage.

The first PMOS transistor may include a gate connected in common with a gate of the first NMOS transistor and configured to receive the switch operation input signal, a drain connected in common with a drain of the first NMOS transistor and an output terminal of the first switch driver and configured to output the inverted signal, and a source connected to the power supply voltage.

The first NMOS transistor may include a gate connected in common with the gate of the first PMOS transistor and configured to receive the switch operation input signal, a drain connected in common with the drain of the first PMOS transistor and the output terminal of the first switch driver and configured to output the inverted signal, and a source connected to the ground voltage.

The second switch driver may include a second PMOS transistor and a second NMOS transistor connected in series between the power supply voltage and the ground voltage. The current limiter may include a third PMOS transistor disposed between the power supply voltage and the second PMOS transistor and a third NMOS transistor disposed between the ground voltage and the second NMOS transistor.

The second PMOS transistor may include a gate connected in common with a gate of the second NMOS transistor and configured to receive the inverted signal output from the output terminal of the first switch driver, a drain connected in common with a drain of the second NMOS transistor and an output terminal of the second switch driver and configured to output the switch control signal, and a source connected to the third PMOS transistor.

The second NMOS transistor may include a gate connected in common with the gate of the second PMOS transistor and configured to receive the inverted signal output from the output terminal of the first switch driver, a drain connected in common with the drain of the second PMOS transistor and the output terminal of the second switch driver and configured to output the switch control signal, and a source connected to the third NMOS transistor.

The third PMOS transistor may be disposed between the second PMOS transistor and a output terminal of the second switch driver, and the third NMOS transistor may be disposed between the second NMOS transistor and the output terminal of the second switch driver.

The bias block may be configured to output a first bias voltage to a gate terminal of the third PMOS transistor, and the current limiter may be configured to determine a magnitude of a first driving current based on the first bias voltage. The bias block may be configured to output a second bias voltage to a gate terminal of the third NMOS transistor, and the current limiter may be configured to determine a magnitude of a second driving current based on the second bias voltage.

In another general aspect, a display driving device may include: a plurality of source buffers configured to generate source signals; a display panel configured to receive the source signals from the plurality of source buffers; a plurality of source buffer output switches respectively connected to the plurality of source buffers and configured to transmit the source signals to the display panel or block the source signals; and a source buffer output switch control circuit configured to generate switch control signals for controlling an operation of the plurality of source buffer output switches. The source buffer output switch control circuit may be configured to control slew rates of the switch control signals for controlling the operation of the plurality of source buffer output switches.

The source buffer output switch control circuit may include: a plurality of switch drivers configured to generate the switch control signals for controlling the operation of the plurality of source buffer output switches based on a switch operation input signal; a plurality of current limiters configured to limit driving currents to control the slew rates of the switch control signals; and a bias block configured to output a bias voltage to the plurality of current limiters for controlling a magnitude of the driving currents. Each switch driver may generate a switch control signal by receiving a first current from a power supply voltage or by transmitting a second current to a ground voltage based on the switch operation input signal. Each current limiter may be configured to limit a magnitude of the first current to a first driving current and to limit a magnitude of the second current to a second driving current.

The slew rate of the plurality of source buffer output switches may be determined based on the slew rates of the switch control signals.

The bias block may be configured to output a first bias voltage for controlling the magnitude of the first driving current and a second bias voltage for controlling the magnitude of the second driving current to the plurality of current limiters.

Each switch driver may include: a first switch driver configured to output an inverted signal obtained by inverting the switch operation input signal; and a second switch driver configured to output the switch control signal by receiving the first current from the power supply voltage or by transmitting the second current to the ground voltage based on the inverted signal.

The first switch driver may include a first PMOS transistor and a first NMOS transistor connected in series between the power supply voltage and the ground voltage.

The first PMOS transistor may include a gate connected in common with a gate of the first NMOS transistor to receive the switch operation input signal, a drain connected in common with a drain of the first NMOS transistor and an output terminal of the first switch driver and configured to output the inverted signal, and a source connected to the power supply voltage.

The first NMOS transistor may include a gate connected in common with the gate of the first PMOS transistor to receive the switch operation input signal, a drain connected in common with the drain of the first PMOS transistor and the output terminal of the first switch driver and configured to output the inverted signal, and a source connected to the ground voltage.

The second switch driver may include a second PMOS transistor and a second NMOS transistor connected in series between the power supply voltage and the ground voltage.

The current limiter may include a third PMOS transistor disposed between the power supply voltage and the second PMOS transistor and a third NMOS transistor disposed between the ground voltage and the second NMOS transistor.

The second PMOS transistor may include a gate connected in common with a gate of the second NMOS transistor to receive the inverted signal output from the output terminal of the first switch driver, a drain connected in common with a drain of the second NMOS transistor and an output terminal of the second switch driver and configured to output the switch control signal, and a source connected to the third PMOS transistor.

The second NMOS transistor may include a gate connected in common with the gate of the second PMOS transistor to receive the inverted signal output from the output terminal of the first switch driver, a drain connected in common with the drain of the second PMOS transistor and the output terminal of the second switch driver and configured to output the switch control signal, and a source connected to the third NMOS transistor.

Each current limiter may include the third PMOS transistor disposed between the second PMOS transistor and a output terminal of the second switch driver, and the third NMOS transistor disposed between the second NMOS transistor and the output terminal of the second switch driver.

Other features and aspects will be apparent from the following detailed description, the drawings, and the claims.

BRIEF DESCRIPTION OF THE DRAWINGS

FIG. 6 illustrates a slew rate change of the switch control signal according to a bias voltage transmitted from a bias block according to one or more embodiments of the present disclosure.

Figure 1:
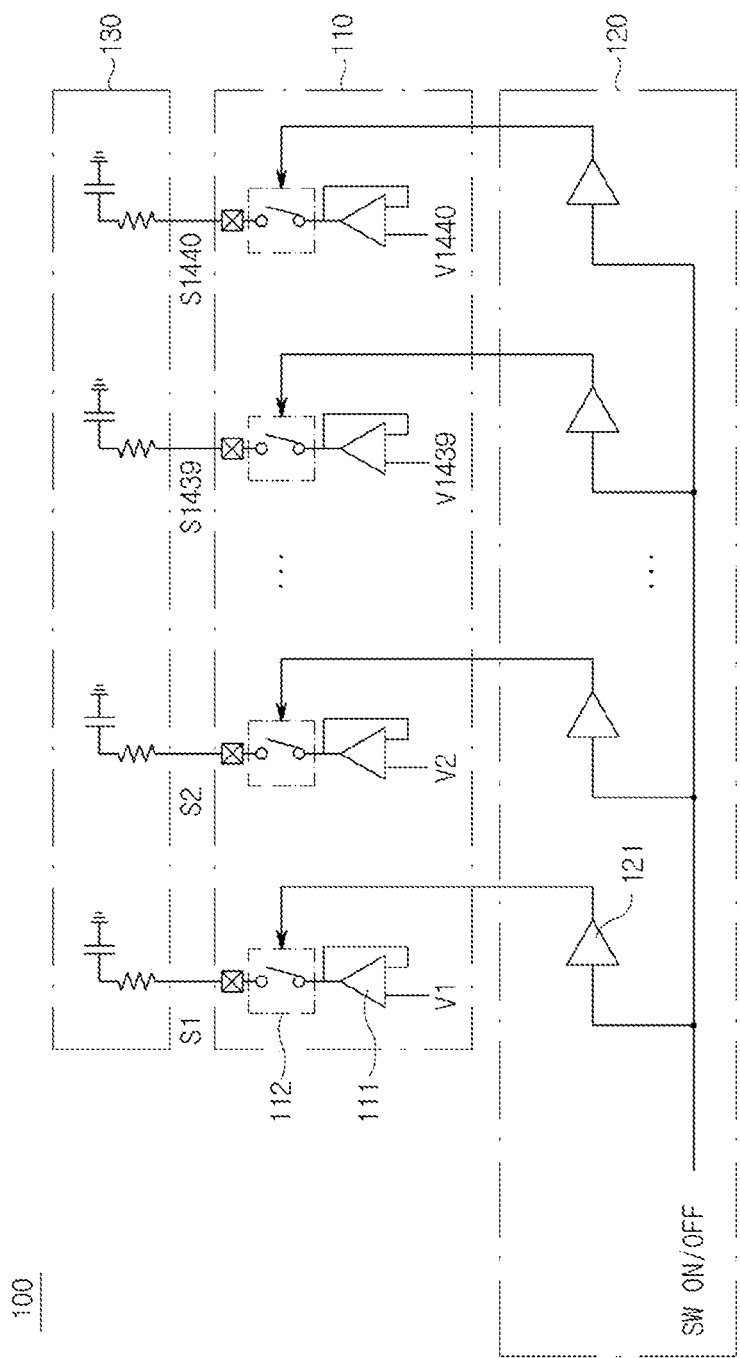
FIG. 1 illustrates a structure of a conventional general display driving device.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on," "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

FIG. 1 illustrates a structure of a conventional general display driving device.

Referring to FIG. 1, a display driving device 100 includes a plurality of source buffers 111, a plurality of source buffer output switches 112 respectively connected to the plurality of source buffers and configured to transmit source signals to a display panel 130 or block the source signals, a source buffer output switch control circuit 120 that controls the operation of the plurality of source buffer output switches 112, and the display panel 130 that receives the source signals.

The plurality of source buffers 111 may be one component of a display data driver 110 that applies the source signals to the display panel 130. The display data driver 110 may arrange and process serially input display data R, G, and B in parallel for each channel, and may supply the source signal (or data signal) to the display panel 130 through the plurality of source buffers 111. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The source buffer output switch 112 may transmit or block the source signals output from the plurality of source buffers 111 to the display panel 130.

The source buffer output switch control circuit 120 may control the source buffer output switch 112 to be in an on or off operating state.

However, as described above, when the source buffer output switch 112 is turned on or off simultaneously and quickly in order to simultaneously transmit the source signal output from thousands or more plural source buffers 111 to the display panel 130 to improve the resolution of the display panel 130, there is a problem that electromagnetic interference occurs due to peak noise. Therefore, it is necessary to control the time required for the source buffer output switch 112 to be turned on or off and then to minimize the occurrence of electromagnetic interference (EMI).

Figure 2A:
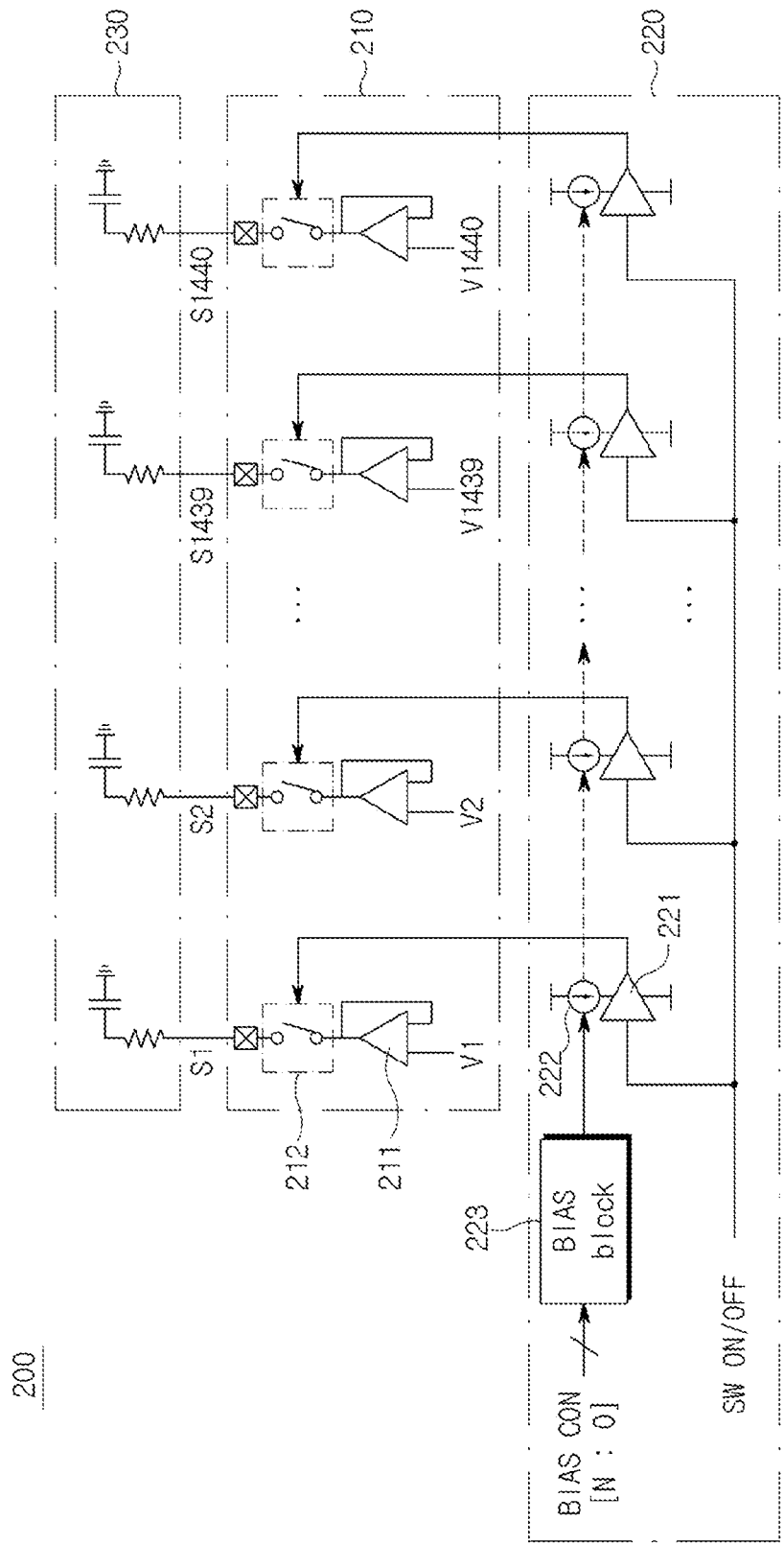
FIGS. 2A and 2B illustrate a display driving device according to one or more embodiments of the present disclosure.
Figure 2B:
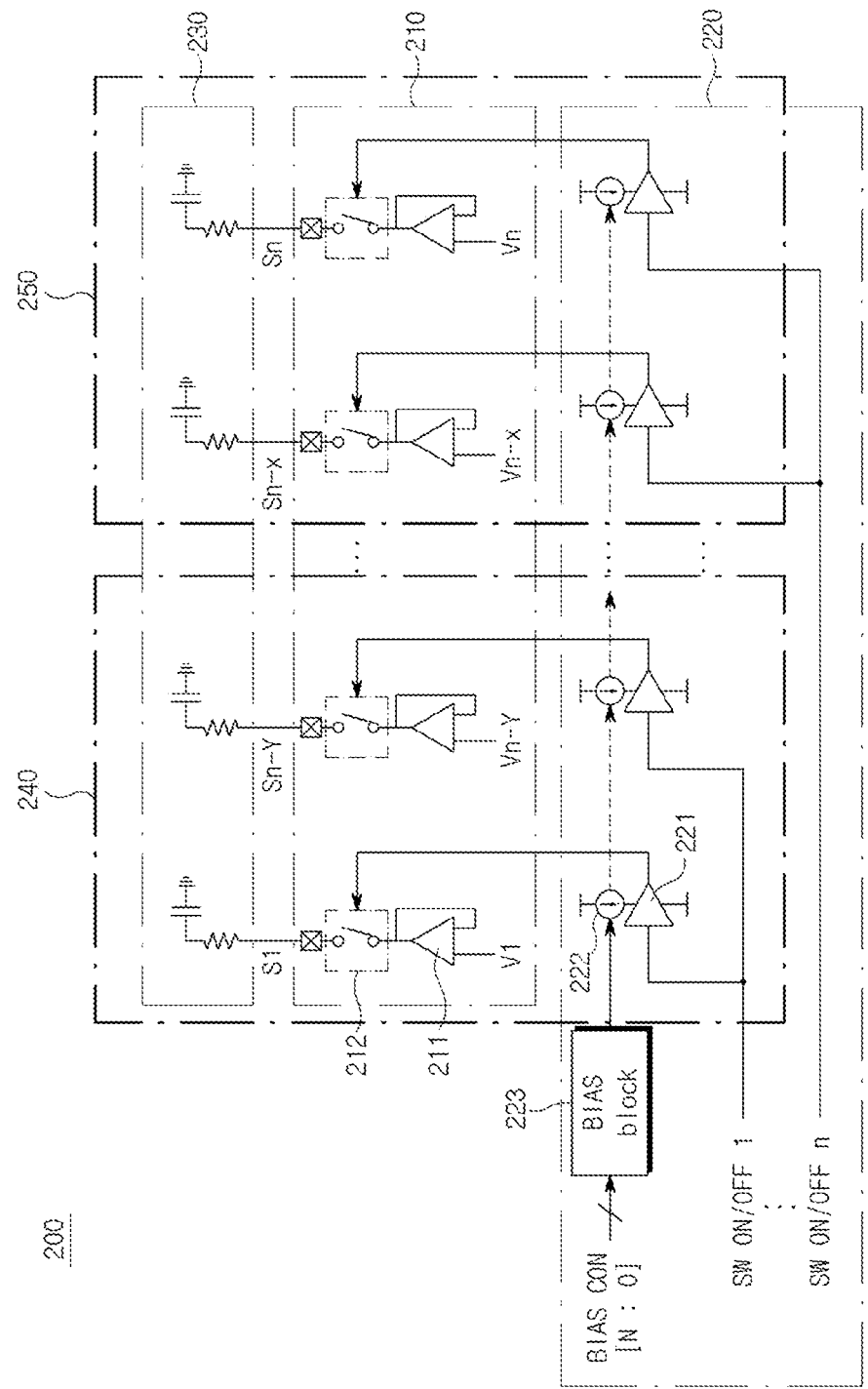

FIGS. 2A and 2B illustrate a display driving device according to one or more embodiments of the present disclosure.

Referring to FIG. 2A, a display driving device 200 includes a plurality of source buffers 211, a plurality of source buffer output switches 212 which are respectively connected to the plurality of source buffers 211 and configured to transmit a source signal to a display panel 230 or block the source signal, a source buffer output switch control circuit 220 that controls the operation of the plurality of source buffer output switches 212, and the display panel 230 that receives the source signal.

The source buffer output switch control circuit 220 may include a switch driver 221 (element 121 in FIG. 1), a current limiter 222 and a bias block 223.

The switch driver 221 may generate a switch control signal that controls the operation of the source buffer output switch 212 based on a switch operation input signal SW ON/OFF.

The current limiter 222 may limit a current applied to the switch driver 221 in order to control a slew rate of the switch control signal according to the switch operation input signal SW ON/OFF.

The bias block 223 may supply the current limiter 222 with a bias voltage for controlling the magnitude of a driving current.

The source buffer output switch control circuit 220 may control the time at which the source buffer output switch 212 is turned on or off based on the slew rate of the switch control signal generated based on the switch operation input signal SW ON/OFF.

The source buffer output switch control circuit 220 may control the time at which the source buffer output switch 212 is turned on or off to prevent that electromagnetic interference (EMI) is simultaneously caused by a sudden signal change in the process of transmitting the source signal from the source buffer 211 to the display panel 230.

Referring to FIG. 2B, the display driving device 200 may divide the display panel 230 connected to a display data driver 210 into at least one or more groups 240 and 250. The operations of the source buffer output switches 212 may be controlled by changing the switch control signal for each group.

The display driving device 200 may vary the magnitude of the bias voltage transmitted from the bias block 223 to the current limiter 222 for each of the groups 240 and 250. The display driving device 200 may vary the slew rate of the switch control signal according to the magnitude of the bias voltage. That is, the display driving device 200 varies the slew rate of the switch control signal for each group, thereby controlling the operating time of the source buffer output switch 212 for each group to be different from each other.

In addition, the display driving device 200 may vary the switch operation input signals SW ON/OFF 1, . . . , and SW ON/OFF n for each of the groups 240 and 250 and may input to the switch driver 221. The switch operation input signals SW ON/OFF 1, . . . , and SW ON/OFF n may be input to the switch driver 221 with a time delay. The switch driver 221 may output switch control signals with a time delay according to the switch operation input signals SW ON/OFF 1, . . . , and SW ON/OFF n.

For example, the following description will be provided by assuming that the display driving device 200, in an example, includes the display data driver 210, the source buffer output switch control circuit 220, and the display panel 230, is composed of 1,440 sets, and is divided into three groups. The first switch operation input signal SW ON/OFF 1 input to the switch driver 221 may output a switch control signal for the first group (set 1 to set 480) of the display driving device 200. Also, the second switch operation input signal SW ON/OFF 2 input to the switch driver 221 may output a switch control signal for the second group (set 481 to set 960) of the display driving device 200. Also, the third switch operation input signal SW ON/OFF 3 input to the switch driver 221 may output a switch control signal for the third group (sets 981 to set 1440) of the display driving device 200. Accordingly, the switch driver 221 may output switch control signals having a time delay based on a time delay between the first to third switch operation input signals SW ON/OFF 1 to 3. Accordingly, the slew rates of the switch control signals for the groups of the display driving device 200 are caused to be different from each other, and thus, the number of signals which are simultaneously changed is reduced, so that the occurrence of electromagnetic interference can be minimized. Hereinafter, a detailed structure of the source buffer output switch control circuit 220 according to one or more embodiments of the present disclosure will be described with reference to FIGS. 3 and 4A to 4F.

Figure 3:
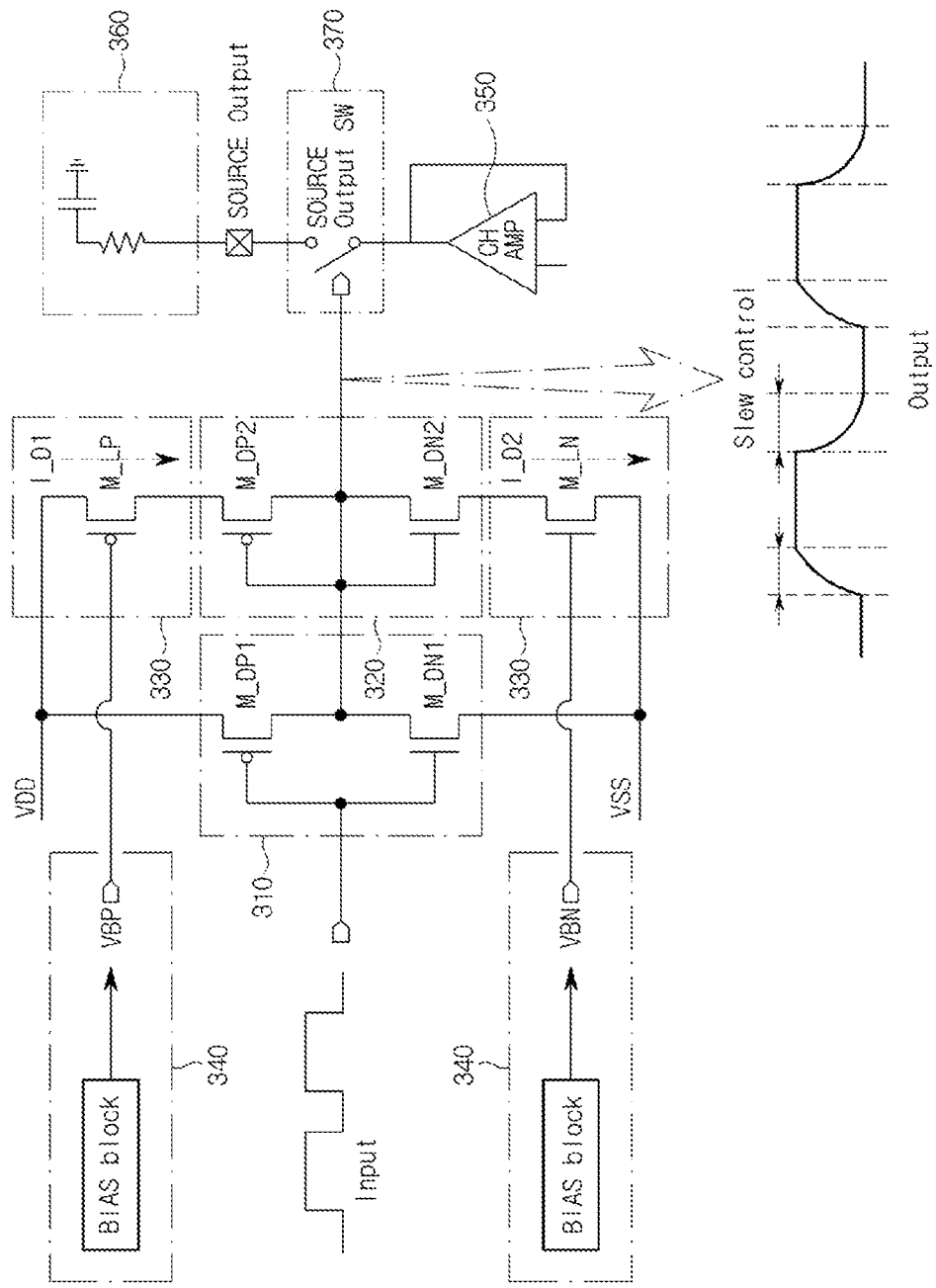
FIG. 3 illustrates a source buffer output switch control circuit according to one or more embodiments of the present disclosure.

FIG. 3 illustrates a source buffer output switch control circuit according to one or more embodiments of the present disclosure.

Referring to FIG. 3, the source buffer output switch control circuit may include switch drivers 310 and 320, a current limiter 330 and a bias block 340.

The switch drivers 310 and 320 may receive a pull-up current from a power supply voltage VDD or may carry a pull-down current to a ground voltage VSS based on the switch operation input signal, thereby generating the switch control signal.

The switch drivers 310 and 320 may include the first switch driver 310 and the second switch driver 320. The first switch driver 310 outputs an inverted signal of the switch operation input signal SW ON/OFF by receiving a current from the power supply voltage VDD or by transmitting a current to the ground voltage VSS based on the switch operation input signal SW ON/OFF. The second switch driver 320 outputs the switch control signal by receiving a pull-up current from the power supply voltage VDD or by transmitting a pull-down current to the ground voltage VSS based on the inverted signal.

Specifically, the first switch driver 310 may include a first PMOS transistor M_DP1 and a first NMOS transistor M_DN1 connected in series between the power supply voltage VDD and the ground voltage VSS.

The first PMOS transistor M_DP1 may include a gate connected in common with a gate of the first NMOS transistor M_DN1 to receive the switch operation input signal SW ON/OFF, a drain connected to an output terminal of the first switch driver 310 to output the inverted signal of the switch operation input signal SW ON/OFF in common with a drain of the first NMOS transistor M_DN1, and a source connected to the power supply voltage VDD.

The first NMOS transistor M_DN1 may include the gate connected in common with the gate of the first PMOS transistor M_DP1 to receive the switch operation input signal SW ON/OFF, the drain connected to an output terminal of the first switch driver 310 to output the inverted signal of the switch operation input signal SW ON/OFF in common with a drain of the first PMOS transistor M_DP1, and a source connected to the ground voltage VSS.

The second switch driver 320 may include a second PMOS transistor M_DP2 and a second NMOS transistor M_DN2 connected in series between the power supply voltage VDD and the ground voltage VSS.

The second PMOS transistor M_DP2 may include a gate connected in common with a gate of the second NMOS transistor M_DN2 to receive the inverted signal of the switch operation input signal SW ON/OFF from the output terminal of the first switch driver 310, a drain connected to an output terminal of the second switch driver 320 to output the switch control signal in common with a drain of the second NMOS transistor M_DN2, and a source which is connected to a third PMOS transistor M_LP used as the current limiter.

The second NMOS transistor M_DN2 may include a gate connected in common with a gate of the second PMOS transistor M_DP2 to receive the inverted signal of the switch operation input signal SW ON/OFF from the output terminal of the first switch driver 310, a drain connected to the output terminal of the second switch driver 320 to output the switch control signal in common with the drain of the second NMOS transistor M_DN2, and a source which is connected to a third NMOS transistor M_LN used as the current limiter.

Based on the bias voltage received from the bias block 340, the current limiter 330 may limit a magnitude of a driving current of the second PMOS transistor M_DP2 to a first driving current I_D1 or may limit a magnitude of a driving current of the second NMOS transistor M_DN2 to a second driving current I_D2.

Specifically, the current limiter 330 may include the third PMOS transistor M_LP which is disposed between the power supply voltage VDD and the second PMOS transistor M_DP2 and the third NMOS transistor M_LN which is disposed between the ground voltage VSS and the second NMOS transistor M_DN2.

The current limiter 330 may receive a first bias voltage VBP from the bias block 340 to a gate terminal of the third PMOS transistor M_LP. The current limiter 330 may limit the magnitude of current transmitted from the power supply voltage VDD to an output terminal of the second switch driver 320 to the first driving current I_D1 flowing through the third PMOS transistor M_LP based on the first bias voltage VBP.

The current limiter 330 may receive a second bias voltage VBN from the bias block 340 to a gate terminal of the third NMOS transistor M_LN. The current limiter 330 may limit the magnitude of current transmitted from an output terminal of the second switch driver 320 to the ground voltage VSS to the second driving current I_D2 flowing through the third NMOS transistor M_LN based on the second bias voltage VBN.

The bias block 340 may transmit, to the gate terminal of the third PMOS transistor M_LP, the first bias voltage VBP which controls the magnitude of the first driving current I_D1 flowing through the third PMOS transistor M_LP.

The bias block 340 may transmit, to the gate terminal of the third NMOS transistor M_LN, the second bias voltage VBN which controls the magnitude of the second driving current I_D2 flowing through the third NMOS transistor M_LN.

FIGS. 4A to 4F illustrate a source buffer output switch control circuit according to one or more embodiments of the present disclosure.

Figure 4A:
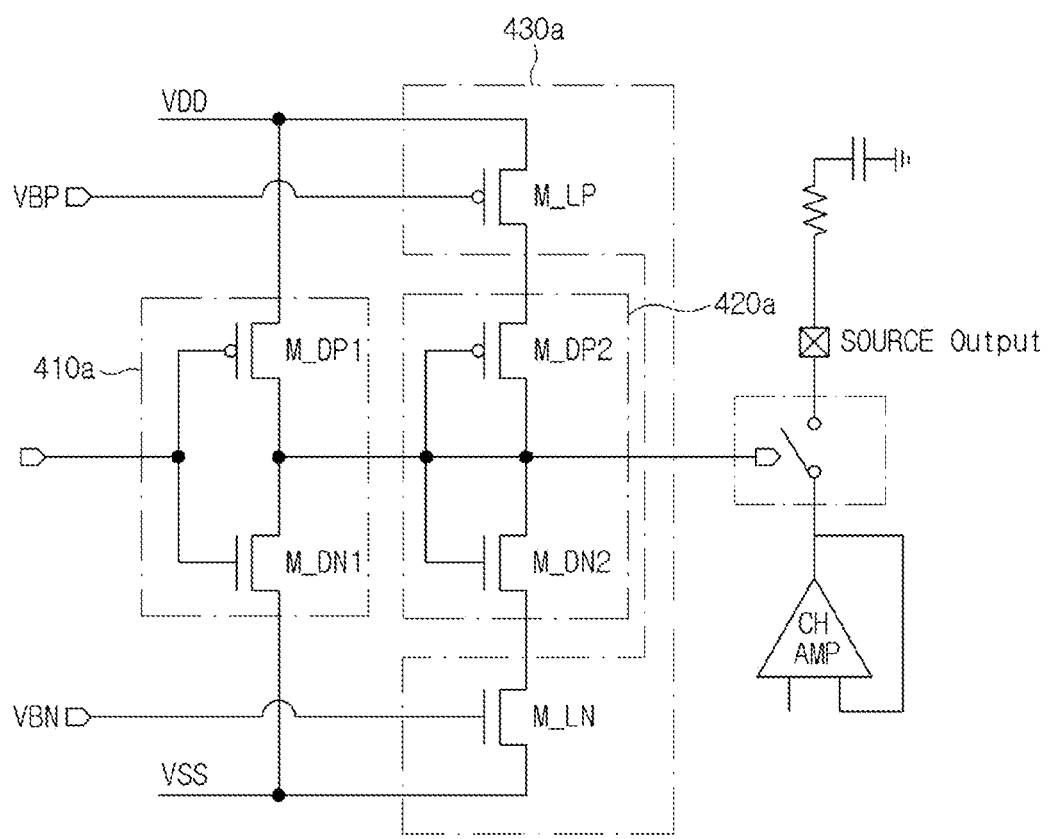
FIGS. 4A to 4F illustrate the source buffer output switch control circuit according to one or more embodiments of the present disclosure.
Figure 4B:
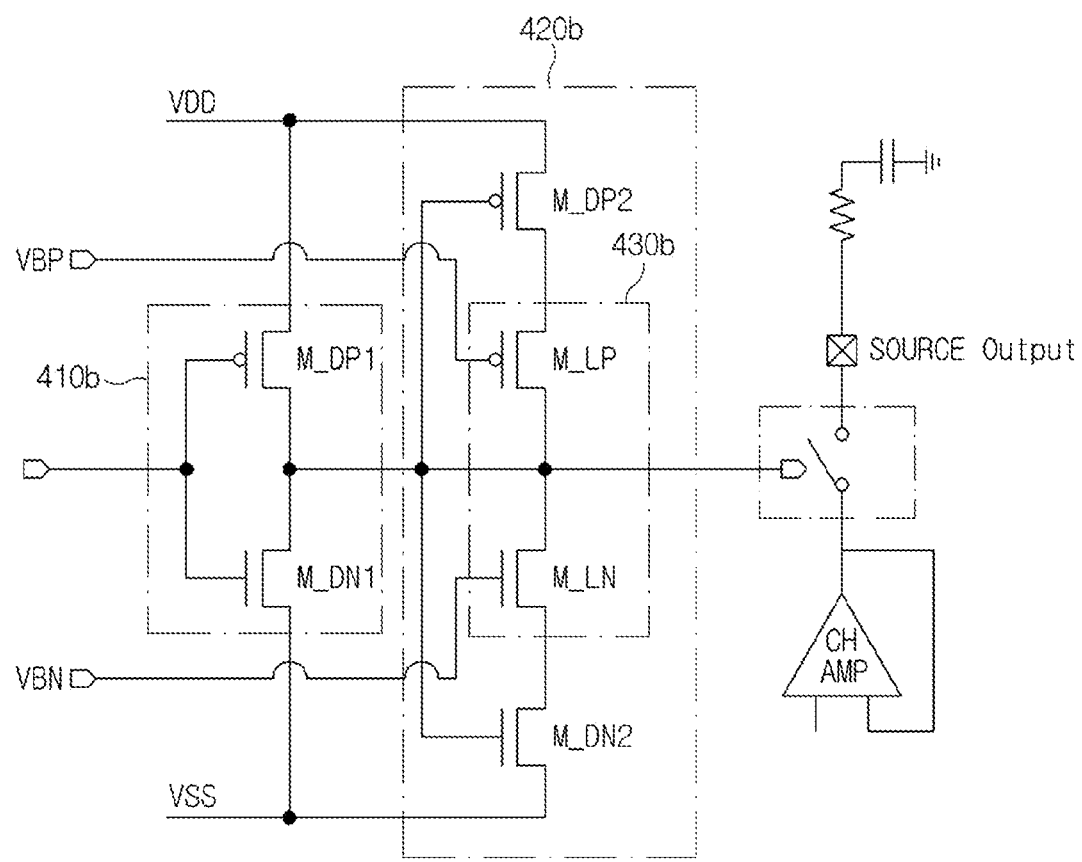

First, referring to FIGS. 4A and 4B, while positions where current limiters 430a and 430b are disposed are different, other components are the same. In FIG. 4A, the third PMOS transistor M_LP may be disposed between the power supply voltage VDD and the second PMOS transistor M_DP2. The first driving current I_D1 flowing through the third PMOS transistor M_LP may limit the magnitude of current transmitted from the power supply voltage VDD to an output terminal of a second switch driver 420a. The third NMOS transistor M_LN may be disposed between the ground voltage VSS and the second NMOS transistor M_DN2. The second driving current I_D2 flowing through the third NMOS transistor M_LN may limit the magnitude of current transmitted from the output terminal of the second switch driver 420a to the ground voltage VSS. In FIGS. 4A through 4F, elements 410a through 410f represent a first switch driver.

Meanwhile, in FIG. 4B, the third PMOS transistor M_LP may be disposed between the second PMOS transistor M_DP2 and the output terminal of the second switch driver 420b. The first driving current I_D1 flowing through the third PMOS transistor M_LP may limit the magnitude of current transmitted from the power supply voltage VDD to an output terminal of a second switch driver 420b. The third NMOS transistor M_LN may be disposed between the second NMOS transistor M_DN2 and the output terminal of the second switch driver 420b. The second driving current I_D2 flowing through the third NMOS transistor M_LN may limit the magnitude of current transmitted from the output terminal of the second switch driver 420b to the ground voltage VSS.

As such, in FIGS. 4A and 4B, only the positions where the third PMOS transistor M_LP and the third NMOS transistor M_LN of the current limiters 430a and 430b are disposed are different, and FIGS. 4A and 4B have the operation in which the current limiters 430a and 430b control the slew rate of the switch control signal generated by the switch operation input signal by limiting the magnitude of current transmitted from the power supply voltage VDD to the output terminals of the second switch drivers 420a and 420b and the magnitude of current transmitted from the output terminals of the second switch drivers 420a and 420b to the ground voltage VSS. Therefore, the following description focuses on the operation of FIG. 4A.

Figure 4C:
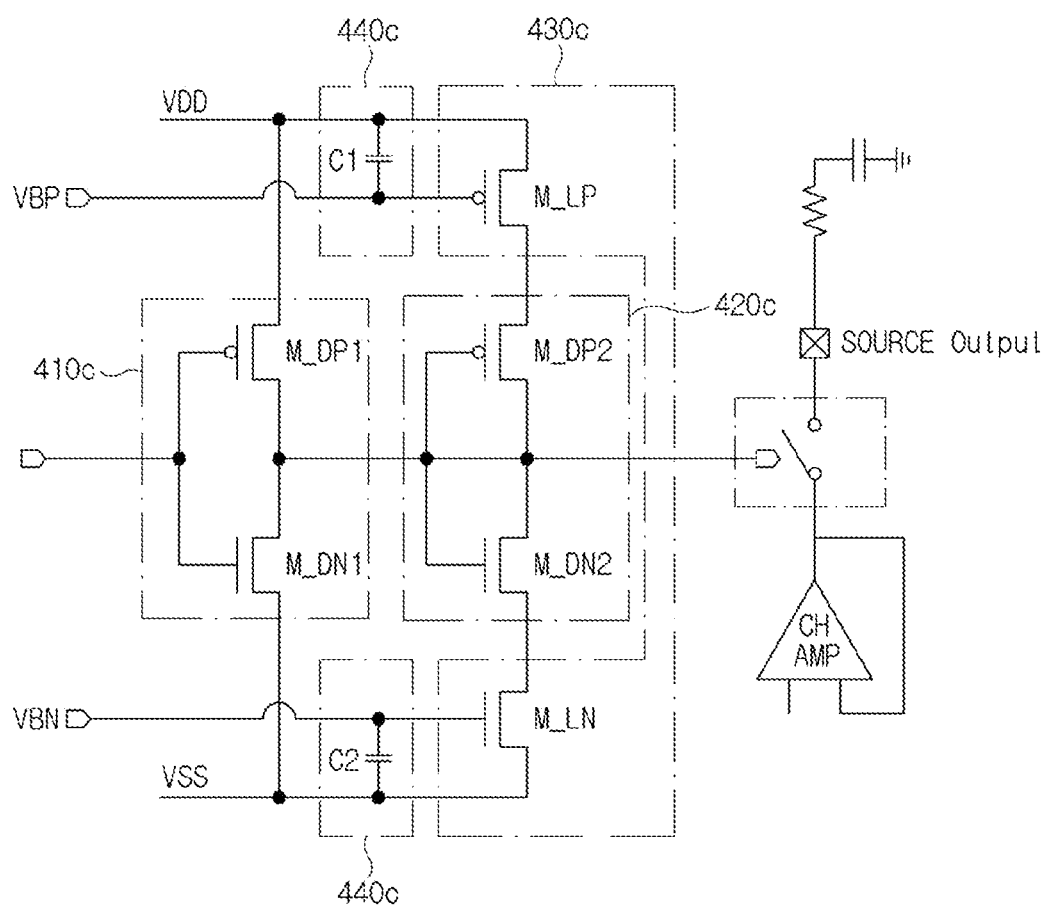
Figure 4D:
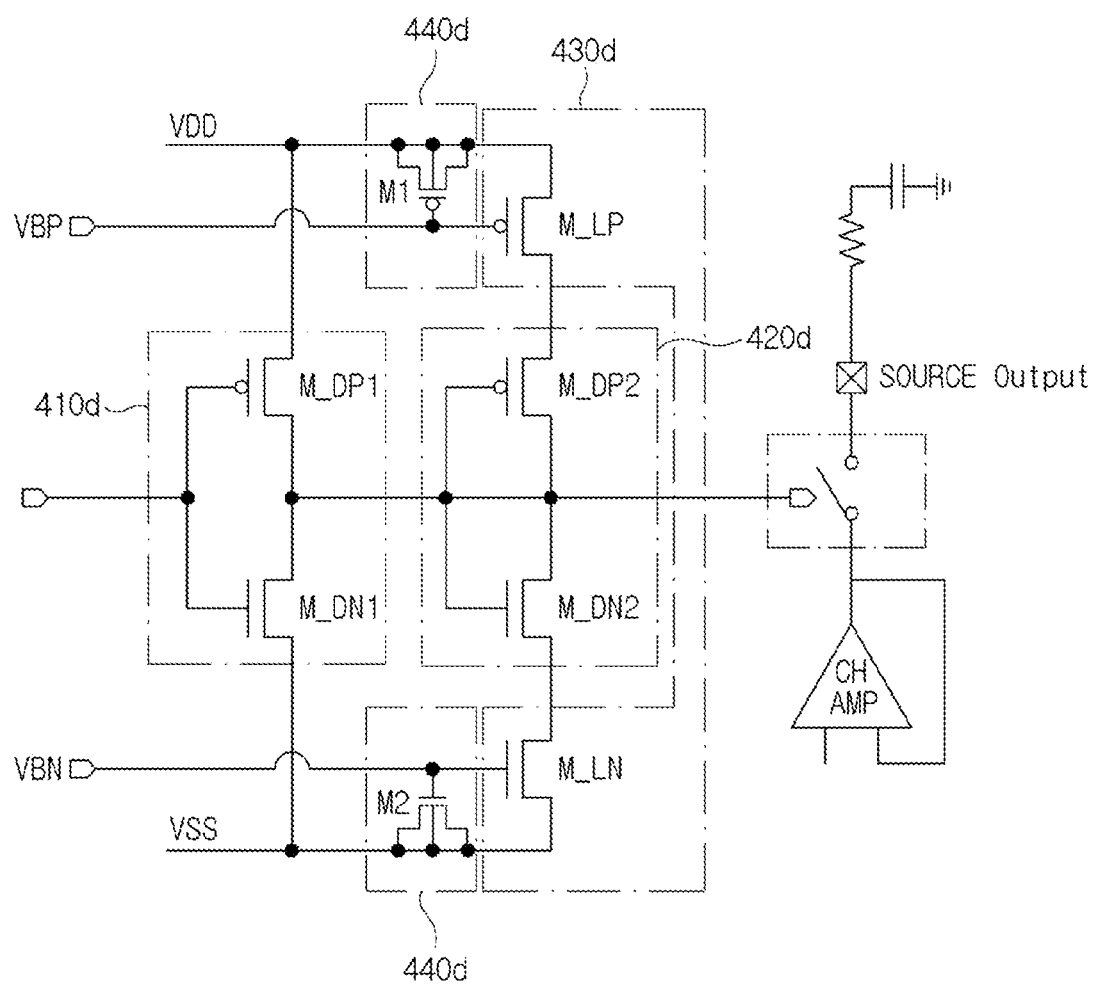

Next, referring to FIGS. 4A, 4C, and 4D. Compared to the FIG. 4A, FIGS. 4C and 4D show a configuration in which a capacitor C1 (440c) or a MOSFET transistor M1 (440d) is added and connected to the gate terminal of the third PMOS transistor M_LP included in current limiters 430c and 430d or a capacitor C2 (440c) or a MOSFET transistor M2 (440d) is added and connected to the gate terminal of the third NMOS transistor M_LN included in the current limiters 430c and 430d. The remaining components are the same as those of FIG. 4A. The capacitor C1 (440c) or the MOSFET transistor M1 (440d) may be connected between the gate terminal of the third PMOS transistor M_LP and the power supply voltage VDD. Also, the capacitor C2 (440c) or the MOSFET transistor M2 (440d) may be connected between the gate terminal of the third NMOS transistor M_LN and the ground voltage VSS. The capacitors C1 and C2 or the MOSFET transistors M1 and M2 are connected between the power supply voltage VDD or the ground voltage VSS and the third PMOS transistor M_LP or the third NMOS transistor M_LN included in the current limiters 430c and 430d, so that the bias voltages VBP and VBN can be more stably provided to the current limiters 430c and 430d.

Figure 4E:
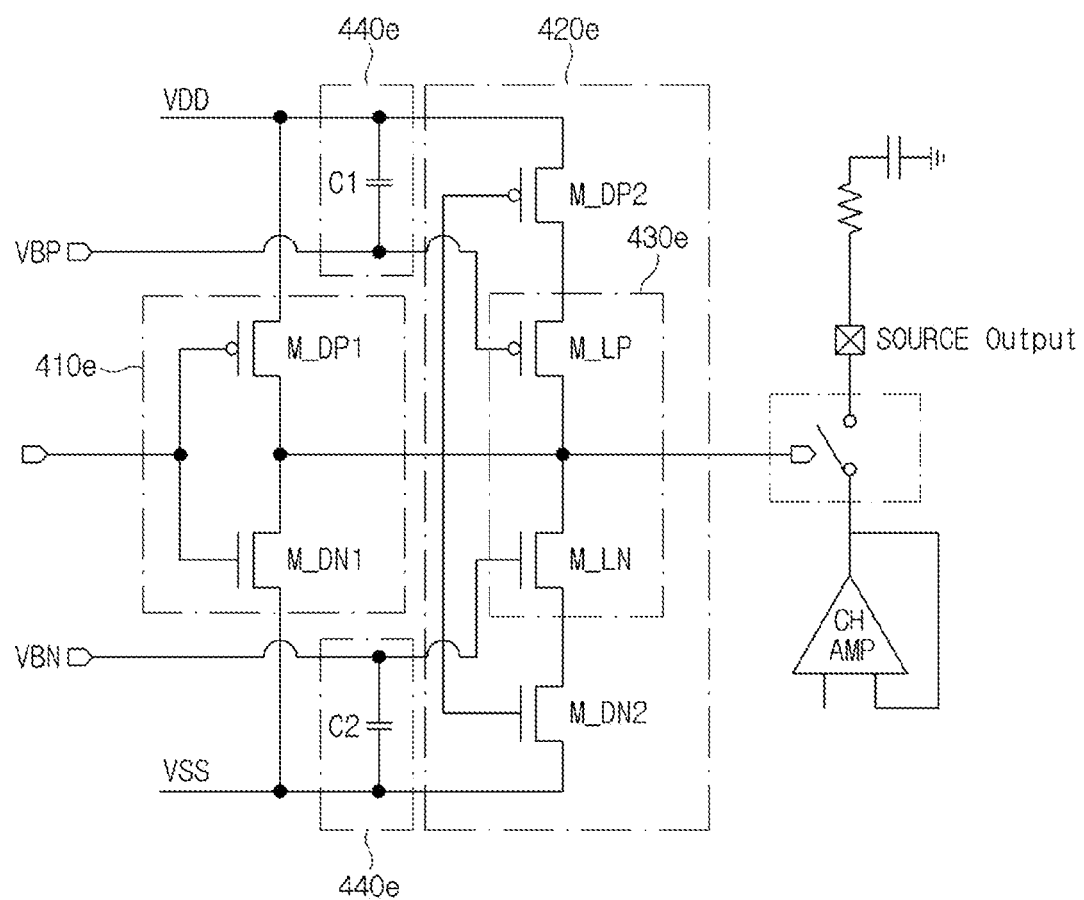
Figure 4F:
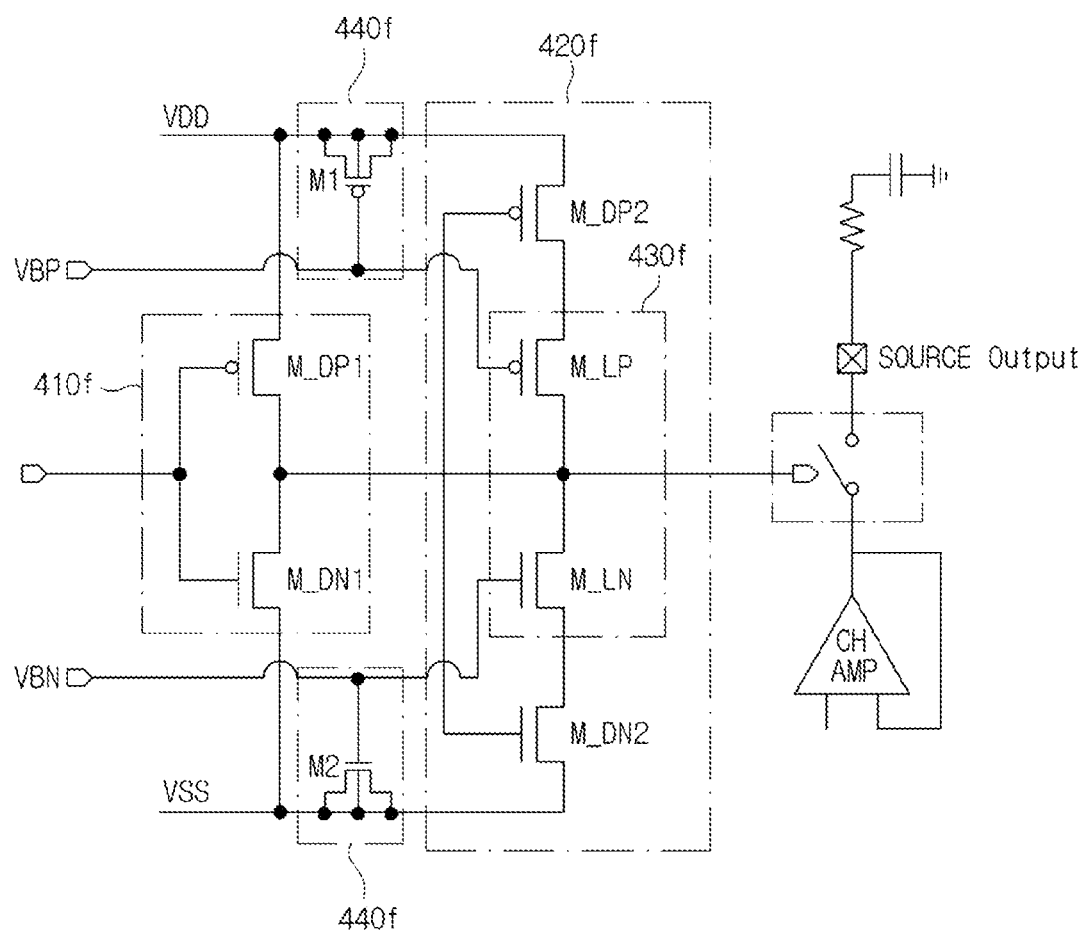

Next, referring to FIGS. 4B, 4E, and 4F. Compared to the FIG. 4B, FIGS. 4E and 4F show a configuration in which a capacitor C1 (440e) or a MOSFET transistor M1 (440f) is added and connected to the gate terminal of the third PMOS transistor M_LP included in current limiters 430e and 430f or a capacitor C2 (440e) or a MOSFET transistor M2 (440f) is added and connected to the gate terminal of the third NMOS transistor M_LN included in the current limiters 430e and 430f. The remaining components are the same as those of FIG. 4B. The capacitor C1 (440e) or the MOSFET transistor M1 (440f) may be connected between the gate terminal of the third PMOS transistor M_LP and the power supply voltage VDD. Also, the capacitor C2 (440e) or the MOSFET transistor M2 (440f) may be connected between the gate terminal of the third NMOS transistor M_LN and the ground voltage VSS. The capacitors C1 and C2 or the MOSFET transistors M1 and M2 are connected between the power supply voltage VDD or the ground voltage VSS and the third PMOS transistor M_LP or the third NMOS transistor M_LN included in the current limiters 430e and 430f, so that the bias voltages VBP and VBN can be more stably provided to the current limiters 430e and 430f.

Hereinafter, the operation of the source buffer output switch control circuit will be described in detail.

Referring back to FIG. 3, first, described will be a method in which, when the switch operation input signal SW ON/OFF rises from low to high, a source buffer output switch 370 of a source buffer 350 is turned on by controlling the slew rate of the switch control signal.

A switch operation input signal SW ON/OFF rising from low to high may be transmitted to a gate terminal of the first switch driver 310. The first PMOS transistor M_DP1 may be turned off by transmitting the switch operation input signal SW ON/OFF rising from low to high to a gate terminal of the first PMOS transistor M_DP1. The first NMOS transistor M_DN1 may be turned on by transmitting the switch operation input signal SW ON/OFF rising from low to high to a gate terminal of the first NMOS transistor M_DN1. Accordingly, current flows from an output terminal of the first switch driver 310 to the ground voltage VSS through the first NMOS transistor M_DN1, and a voltage level of the output terminal of the first switch driver 310 may be close to ground voltage VSS. That is, a signal that has fallen to the level of the ground voltage VSS may be transmitted to the gate terminals of the second NMOS transistor M_DN2 and the second PMOS transistor M_DP2 of the second switch driver 320.

When the signal that has fallen to the level of the ground voltage VSS is transmitted to the gate terminal of the second PMOS transistor M_DP2, the second PMOS transistor M_DP2 may be turned on. When the signal that has fallen to the level of the ground voltage VSS is transmitted to the gate terminal of the second NMOS transistor M_DN2, the second NMOS transistor M_DN2 may be turned off. Accordingly, current is transmitted from the power supply voltage VDD to the output terminal of the second switch driver 320, and then the output terminal of the second switch driver 320 may output the switch control signal having a level of the power supply voltage VDD.

Here, the current limiter 330 may receive the first bias voltage VBP from the bias block 340 to a gate terminal of the third PMOS transistor M_LP. And, the current limiter 330 may limit the magnitude of current transmitted from the power supply voltage VDD to an output terminal of the second switch driver 320 to the first driving current I_D1 flowing through the third PMOS transistor M_LP based on the first bias voltage VBP. When the magnitude of the current transmitted to the output terminal of the second switch driver 320 is limited by the first driving current I_D1, the magnitude of the current flowing through the second PMOS transistor M_DP2 is limited, and accordingly, the slew rate of the switch control signal may be smaller than that when the magnitude of the current is not limited in the related art.

When the slew rate of the switch control signal is reduced, the time for which the source buffer output switch 370 that transmits the source signal output from the source buffer 350 to the display panel 360 changes from an off state to an on state is increased and sudden change in the magnitude is reduced, so that electromagnetic interference (EMI) can be minimized.

Next, described will be a method in which, when the switch operation input signal SW ON/OFF falls from high to low, the source buffer output switch 370 of the source buffer 350 is turned off by controlling the slew rate of the switch control signal.

A switch operation input signal SW ON/OFF falling from high to low may be transmitted to the gate terminal of the first switch driver 310. The first PMOS transistor M_DP1 may be turned on by transmitting the switch operation input signal SW ON/OFF falling from high to low to the gate terminal of the first PMOS transistor M_DP1. The first NMOS transistor M_DN1 may be turned off by transmitting the switch operation input signal SW ON/OFF falling from high to low to the gate terminal of the first NMOS transistor M_DN1.

Accordingly, current flows from the power supply voltage VDD to the output terminal of the first switch driver 310 through the first PMOS transistor M_DP1, and the voltage level of the output terminal of the first switch driver 310 may rise to power supply voltage VDD. That is, a signal that has risen to the level of the power supply voltage VDD may be transmitted to the gate terminals of the second NMOS transistor M_DN2 and the second PMOS transistor M_DP2 of the second switch driver 320.

When a signal that has risen to the level of the power supply voltage VDD is transmitted to the gate terminal of the second PMOS transistor M_DP2, the second PMOS transistor M_DP2 may be turned off. When the signal that has risen to the level of the power supply voltage VDD is transmitted to the gate terminal of the second NMOS transistor M_DN2, the second NMOS transistor M_DN2 may be turned on. Accordingly, current is transmitted to the ground voltage VSS, and then the output terminal of the second switch driver 320 may output the switch control signal having a level of the ground voltage VSS.

Here, the current limiter 330 may receive the second bias voltage VBN from the bias block 340 to the gate terminal of the third NMOS transistor M_LN. And, the current limiter 330 may limit the magnitude of current transmitted from the output terminal of the second switch driver 320 to the ground voltage VSS to the second driving current I_D2 flowing through the third NMOS transistor M_LN based on the second bias voltage VBN. When the magnitude of the current transmitted by the output terminal of the second switch driver 320 is limited by the second driving current I_D2, the magnitude of the current flowing through the second NMOS transistor M_DN2 is limited, and accordingly, the slew rate of the switch control signal may be smaller than that when the magnitude of the current is not limited in the related art.

When the slew rate of the switch control signal is reduced, the time for which the source buffer output switch 370 that transmits the source signal output from the source buffer 350 to the display panel 360 changes from an on state to an off state is increased, so that electromagnetic interference (EMI) can be minimized.

Figure 5:
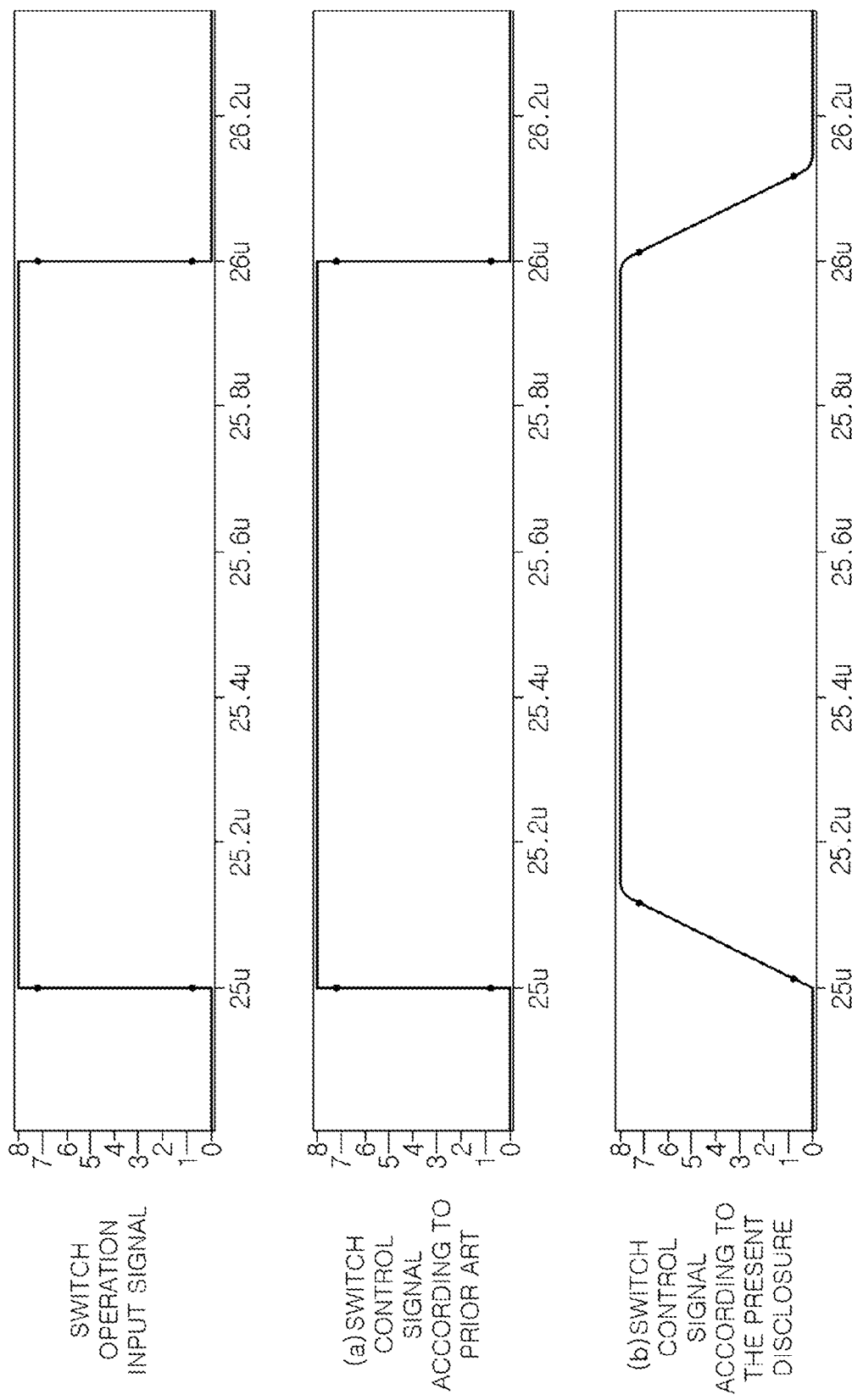
FIG. 5 illustrates a slew rate of a switch control signal according to a current limit based on one or more embodiments of the present disclosure.

FIG. 5 illustrates a slew rate of the switch control signal according to the current limit based on one or more embodiments of the present disclosure.

Referring to FIG. 5, as compared with a slewing time (a) representing the time when the switch control signal changes from the ground voltage VSS to the power supply voltage VDD according to the related art that does not limit the magnitude of the current, it can be seen that the slewing time (b) of the switch control signal according to one or more embodiments the present disclosure is increased about 50 times or more. The slewing time is sufficiently obtained, so that the time for which the source buffer output switch changes from an off state to an on state is increased. Accordingly, as the slew rate of the source buffer output switch decreases, the magnitude of the signal that increases per unit time can also be decreased. As a result, the occurrence of electromagnetic interference (EMI) can be minimized.

In FIG. 5, only the case where the switch operation input signal rises from low to high has been described. However, conversely, even in the case where the switch operation input signal falls from high to low, the slewing time is sufficiently obtained, so that the time for which the source buffer output switch changes from an on state to an off state is increased. Accordingly, as the slew rate of the source buffer output switch decreases, the magnitude of the signal that increases per unit time can also be decreased. As a result, the occurrence of electromagnetic interference (EMI) can be minimized.

FIG. 6 illustrates a slew rate change of the switch control signal according to the bias voltage transmitted from the bias block according to one or more embodiments of the present disclosure.

The current flowing through the current limiter is controlled by varying the bias voltage transmitted to the current limiter, the slewing times (a) to (d) of the switch control signal may be varied within a range that does not affect the image quality.

Referring to FIG. 6, as a value of a 2-bit input parameter input to the bias block 340 increases, the higher first bias voltage VBP may be output to the third PMOS transistor M_LP and the lower second bias voltage VBN may be output to the third NMOS transistor M_LN. For example, set values of the input parameters can be set to 2-bit values of "00" (a), "01" (b), "10" (c), and "11" (d). When the set value of the input parameter is "11" (d), the bias block 340 may generate a higher first bias voltage VBP than when the set value is "00" (a), and may transmit the first bias voltage VBP to the current limiter 330, and the bias block 340 may generate the lower second bias voltage VBN than when the set value is "00" (a), and may transmit the second bias voltage VBN to the current limiter 330. The current limiter 330 may limit the magnitude of the driving current according to the magnitude of the received bias voltage. Referring to FIG. 6, it can be seen that the slew rate or slewing time may be changed as the magnitude of the bias voltage changes. In particular, it can be seen that the slewing time becomes longer as the value of the 2-bit input parameter increases. As the slewing time increases, electromagnetic interference (EMI) can be further decreased.

Although the present disclosure has been described with reference to the embodiment shown in the drawings, this is just an example and it will be understood by those skilled in the art that various modifications and equivalent thereto may be made. Therefore, the true technical scope of the present disclosure should be determined by the spirit of the appended claims.

According to one or more embodiments of the present disclosure, the operation time of the source buffer output switch which transmits the source signal output from the source buffer to the display panel or blocks the source signal is controlled, so that the electromagnetic interference (EMI) is minimized within a range that does not affect the image quality.

Also, the plurality of source buffers are divided into at least one or more groups and the slew rates of the switch control signals for the groups are caused to be different from each other, and thus, the number of signals which are simultaneously changed is reduced, so that the occurrence of electromagnetic interference can be minimized.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A source buffer output switch control circuit for controlling operations of a source buffer output switch configured to transmit a source signal output from a source buffer to a display panel or block the source signal, the source buffer output switch control circuit comprising:
 a switch driver configured to generate a switch control signal for controlling the operations of the source buffer output switch based on a switch operation input signal;
 a current limiter configured to limit a driving current applied to the switch driver in order to control a slew rate of the switch control signal; and
 a bias block configured to generate a bias voltage based on a value of a two-bit input parameter input to the bias block and to transmit the bias voltage to the current limiter to control a magnitude of the driving current,
 wherein as the value of the two-bit input parameter input to the bias block increases from '00' to '01', '10', and '11', the bias block is configured to transmit a higher first bias voltage to a gate of a PMOS transistor of the current limiter and a lower second bias voltage to a gate of an NMOS transistor of the current limiter than when the value is "00" to increase a slewing time of the switch control signal.

2. The source buffer output switch control circuit of claim 1, wherein a slew rate of the source buffer output switch is determined based on the slew rate of the switch control signal.

3. The source buffer output switch control circuit of claim 1,
 wherein, based on the switch operation input signal, the switch driver is configured to receive a first current from a power supply voltage or transmit a second current to a ground voltage, thereby generating the switch control signal, and
 wherein the current limiter is configured to limit a magnitude of the first current to a first driving current and to limit a magnitude of the second current to a second driving current.

4. The source buffer output switch control circuit of claim 3, wherein the bias block is configured to transmit to the current limiter a first bias voltage controlling the magnitude of the first driving current and a second bias voltage controlling the magnitude of the second driving current.

5. The source buffer output switch control circuit of claim 1, wherein the switch driver comprises:
 a first switch driver configured to output an inverted signal obtained by inverting the switch operation input signal; and
 a second switch driver configured to output the switch control signal by receiving a first current from a power supply voltage or by transmitting a second current to a ground voltage based on the inverted signal.

6. The source buffer output switch control circuit of claim 5, wherein the first switch driver comprises a first PMOS transistor and a first NMOS transistor connected in series between the power supply voltage and the ground voltage,
 wherein the first PMOS transistor comprises:
  a gate connected in common with a gate of the first NMOS transistor and configured to receive the switch operation input signal,
  a drain connected in common with a drain of the first NMOS transistor and an output terminal of the first switch driver and configured to output the inverted signal, and
  a source connected to the power supply voltage, and
 wherein the first NMOS transistor comprises:
  a gate connected in common with the gate of the first PMOS transistor and configured to receive the switch operation input signal,
  a drain connected in common with the drain of the first PMOS transistor and the output terminal of the first switch driver and configured to output the inverted signal, and
  a source connected to the ground voltage.

7. The source buffer output switch control circuit of claim 6, wherein the bias block is configured to output a first bias voltage and a second bias voltage to the current limiter.

8. The source buffer output switch control circuit of claim 7, wherein the current limiter is configured to determine a magnitude of a first driving current based on the first bias voltage and a magnitude of a second driving current based on the second bias voltage.

9. The source buffer output switch control circuit of claim 8,
 wherein the second switch driver comprises a second PMOS transistor and a second NMOS transistor connected in series between the power supply voltage and the ground voltage, and
 wherein the PMOS transistor of the current limiter is disposed between the power supply voltage and the second PMOS transistor, and the NMOS transistor of the current limiter is disposed between the ground voltage and the second NMOS transistor.

10. The source buffer output switch control circuit of claim 9,
 wherein the second PMOS transistor comprises:
  a gate connected in common with a gate of the second NMOS transistor and configured to receive the inverted signal output from the output terminal of the first switch driver,
  a drain connected in common with a drain of the second NMOS transistor and an output terminal of the second switch driver and configured to output the switch control signal, and
  a source connected to the PMOS transistor, and
 wherein the second NMOS transistor comprises:
  a gate connected in common with the gate of the second PMOS transistor and configured to receive the inverted signal output from the output terminal of the first switch driver,
  a drain connected in common with the drain of the second PMOS transistor and the output terminal of the second switch driver and configured to output the switch control signal, and
  a source connected to the NMOS transistor.

11. The source buffer output switch control circuit of claim 8,
 wherein the second switch driver comprises a second PMOS transistor and a second NMOS transistor disposed between the power supply voltage and the ground voltage, and
 wherein the PMOS transistor of the current limiter is disposed between the second PMOS transistor and a output terminal of the second switch driver, and the NMOS transistor of the current limiter is disposed between the second NMOS transistor and the output terminal of the second switch driver.

12. A display driving device comprising:
a plurality of source buffers configured to generate source signals;
a display panel configured to receive the source signals from the plurality of source buffers;
a plurality of source buffer output switches respectively connected to the plurality of source buffers and configured to transmit the source signals to the display panel or block the source signals; and
a source buffer output switch control circuit configured to generate switch control signals for controlling an operation of the plurality of source buffer output switches,
wherein the source buffer output switch control circuit comprises a bias block configured to generate a bias voltage based on a value of a two-bit input parameter input to the bias block, and to transmit the bias voltage to a plurality of current limiters to control a magnitude of driving currents and to control slew rates of the switch control signals, and
wherein as the value of the two-bit input parameter input to the bias block increases from '00' to '01', '10', and '11', the bias block is configured to transmit a higher first bias voltage to a gate of a PMOS transistor of each of the plurality of current limiters and a lower second bias voltage to a gate of an NMOS transistor of each of the plurality of current limiters than when the value is "00" to increase a slewing time of the switch control signals.

13. The display driving device of claim 12, wherein the source buffer output switch control circuit comprises:
a plurality of switch drivers configured to generate the switch control signals for controlling the operation of the plurality of source buffer output switches based on a switch operation input signal,
wherein the plurality of current limiters are configured to limit the driving currents to control the slew rates of the switch control signals,
wherein each switch driver generates a switch control signal by receiving a first current from a power supply voltage or by transmitting a second current to a ground voltage based on the switch operation input signal, and
wherein each current limiter is configured to limit a magnitude of the first current to a first driving current and to limit a magnitude of the second current to a second driving current.

14. The display driving device of claim 13, wherein slew rates of the plurality of source buffer output switches are determined based on the slew rates of the switch control signals.

15. The display driving device of claim 14, wherein the bias block is configured to output a first bias voltage for controlling the magnitude of the first driving current and a second bias voltage for controlling the magnitude of the second driving current to the plurality of current limiters.

16. The display driving device of claim 13, wherein each switch driver comprises:
a first switch driver configured to output an inverted signal obtained by inverting the switch operation input signal; and
a second switch driver configured to output the switch control signal by receiving the first current from the power supply voltage or by transmitting the second current to the ground voltage based on the inverted signal.

17. The display driving device of claim 16, wherein the first switch driver comprises a first PMOS transistor and a first NMOS transistor connected in series between the power supply voltage and the ground voltage,
wherein the first PMOS transistor comprises a gate connected in common with a gate of the first NMOS transistor to receive the switch operation input signal, a drain connected in common with a drain of the first NMOS transistor and an output terminal of the first switch driver and configured to output the inverted signal, and a source connected to the power supply voltage, and
wherein the first NMOS transistor comprises a gate connected in common with the gate of the first PMOS transistor to receive the switch operation input signal, a drain connected in common with the drain of the first PMOS transistor and the output terminal of the first switch driver and configured to output the inverted signal, and a source connected to the ground voltage.

18. The display driving device of claim 17, wherein the second switch driver comprises a second PMOS transistor and a second NMOS transistor connected in series between the power supply voltage and the ground voltage, and
wherein each current limiter comprises a third the PMOS transistor disposed between the power supply voltage and the second PMOS transistor and a third the NMOS transistor disposed between the ground voltage and the second NMOS transistor.

19. The display driving device of claim 18, wherein the second PMOS transistor comprises a gate connected in common with a gate of the second NMOS transistor to receive the inverted signal output from the output terminal of the first switch driver, a drain connected in common with a drain of the second NMOS transistor and an output terminal of the second switch driver and configured to output the switch control signal, and a source connected to the PMOS transistor, and
wherein the second NMOS transistor comprises a gate connected in common with the gate of the second PMOS transistor to receive the inverted signal output from the output terminal of the first switch driver, a drain connected in common with the drain of the second PMOS transistor and the output terminal of the second switch driver and configured to output the switch control signal, and a source connected to the NMOS transistor.

20. The display driving device of claim 17, wherein the second switch driver comprises a second PMOS transistor and a second NMOS transistor disposed between the power supply voltage and the ground voltage, and
wherein each current limiter comprises the PMOS transistor disposed between the second PMOS transistor and a output terminal of the second switch driver, and the NMOS transistor disposed between the second NMOS transistor and the output terminal of the second switch driver.

* * * * *